(12) United States Patent
Codama et al.

(10) Patent No.: US 6,479,334 B1
(45) Date of Patent: *Nov. 12, 2002

(54) THIN FILM TRANSISTOR AND SEMICONDUCTOR DEVICE AND METHOD FOR FORMING THE SAME

(75) Inventors: Mitsufumi Codama; Yukio Yamauchi; Naoya Sakamoto; Takeshi Fukada, all of Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/444,405

(22) Filed: Nov. 22, 1999

Related U.S. Application Data (60) Continuation of application No. 08/744,660, filed on Nov. 6, 1996, now Pat. No. 6,008,076, which is a continuation of application No. 08/191,709, filed on Feb. 4, 1994, now abandoned, which is a division of application No. 07/856,643, filed on Mar. 24, 1992, now abandoned.

(30) Foreign Application Priority Data

Mar. 25, 1991 (JP) ................................. 3-84655

(51) Int. Cl.⁷ .................... H01L 21/00; H01L 21/84
(52) U.S. Cl. .................. 438/161; 438/164; 438/166
(58) Field of Search ................. 438/151–166

(56) References Cited

U.S. PATENT DOCUMENTS

| 4,597,160 A | 7/1986 | Ipri |
|---|---|---|
| 4,693,759 A | 9/1987 | Noguchi et al. |
| 4,851,363 A | 7/1989 | Troxell et al. |
| 5,108,843 A | 4/1992 | Ohtaka et al. |
| 5,254,208 A | 10/1993 | Zhang |
| 5,294,238 A | 3/1994 | Fukada et al. |
| 5,716,857 A | 2/1998 | Zhang .................. 437/21 |
| 6,008,076 A | * 12/1999 | Codama et al. ......... 438/151 |
| 6,008,078 A | 12/1999 | Zhang .................. 438/164 |

FOREIGN PATENT DOCUMENTS

| JP | 2-219239 | 8/1990 |
|---|---|---|
| JP | 2-219240 | 8/1990 |

OTHER PUBLICATIONS

Lemons et al., "Laser rystallization of Si films on glass", Applied Physics Letters, vol. 40, #6, pp. 469–471, Mar. 15, 1992.

\* cited by examiner

*Primary Examiner*—Richard Booth
(74) *Attorney, Agent, or Firm*—Nixon Peabody LLP; Jeffrey L. Costellia

(57) ABSTRACT

A thin film transistor and a semiconductor device and a method for forming the same. A silicon thin film formed on an insulating substrate is heated at 550 to 800° C. so that it has crystallinity, and a thin film transistor is formed using the crystalline silicon film thus obtained. Thermal contraction of the insulating substrate is set in a range of 30 to 500 ppm in the heating process, so that the thin film transistor has high mobility, low threshold voltage and high off-resistance. Thermal contraction of the insulating substrate may be also set 100 ppm or less in a heating process after a patterning treatment in a thin film transistor producing process.

53 Claims, 8 Drawing Sheets

THIN FILM TRANSISTOR AND SEMICONDUCTOR DEVICE AND METHOD FOR FORMING THE SAME

This application is a Continuation of application Ser. No. 08/744,660 filed Nov. 6, 1996 is now a U.S. Pat. No. 6,008,076; which itself is a Continuation of application Ser. No. 08/191,709 filed Feb. 4, 1994 is now abandoned; which is a Division of application Ser. No. 07/856,643 filed Mar. 24, 1992, now abandoned.

BACKGROUND OF THE INVENTION

1. Field of the Invention

This invention relates to a thin film transistor and a semiconductor device and a method for forming the same, more particularly to a method of producing a silicon thin film transistor for use in an active matrix drive type liquid crystal display, an image sensor, a thermal head, etc., and to a silicon thin film transistor manufactured by the same.

2. Description of Prior Art

A silicon thin film transistor has been hitherto utilized in a liquid crystal display for a compact TV or computer, and an active element or a part of a drive circuit for an image sensor and a thermal head which are used in a facsimile machine, etc. An amorphous silicon thin film transistor is being most vigorously developed now because it can be manufactured relatively easily and designed in a large area.

The amorphous silicon thin film transistor, however, has a demerit that electron and hole mobilities are very small, 1 $cm^2$/Vsec and 0.1 $cm^2$/Vsec respectively. This is not a critical problem, for example when it is used to perform a switching operation of each pixel of a liquid crystal display or each bit of an image sensor, but is a critical problem particularly in a switching speed when a drive circuit is constructed on same substrate.

On the other hand, a polycrystal silicon thin film transistor which has been used for a compact-size liquid crystal TV or an image sensor has electron and hole mobilities of about 10 $cm^2$/Vsec, and some driving circuits comprising polycrystal silicon thin film transistors are actually marketed as a product. However, the polycrystal silicon thin film transistor is also insufficient to satisfy scale-up and speed-up needs of a device. The polycrystal silicon thin film transistor has polycrystal silicon film formed in an active layer by an LPCVD method, for example. Such polycrystal silicon has a high potential barrier at a grain boundary, so that both of electron and hole mobilities are limited to about 10 $cm^2$/Vsec or less. In addition, in most cases, cost is high because of use of expensive quartz as a substrate.

Apart from such amorphous silicon thin film transistor or polycrystal silicon thin film transistor, another method in which amorphous silicon film is formed on a substrate formed of quartz or glass, and then heated for a long time to be grown in solid phase and crystallized has been recently studied. This method provides a thin film transistor having a high mobility of several times to several-tens times of that of a polycrystal silicon thin film transistor (this is dependent on a process condition), and also has high productivity, so that this method is more effective for the next generation's active matrix drive liquid crystal display having driving circuits formed on the same large substrate, for example.

Since a quartz substrate is durable to high temperature above 1000° C., the following advantages are obtained: a gate insulation film formed by thermal oxidation of silicon active layer, which is used generally in silicon wafer process, can be adopted, and a quartz substrate provides a good silicon/silicon-oxide interface. However, the thin film transistor grown in solid phase on the quartz substrate by above method has not only a problem that stable and uniform characteristics cannot be obtained because of lack of uniformity of thermal contraction of quartz, but also a problem that there occurs a failure due to an instability phenomenon that reduction of off resistance and current-curve variation with time lapse are developed, and these problems make it difficult to realize large-area device. In addition, the quartz substrate is more expensive several times than glass, especially for a large-area substrate, so that the quartz would be unsuitable as substrate in this respect.

On the other hand, relatively-low cost glass which is durable to a thermal process of about 600° C. at maximum has been recently developed. Some kinds of this glass can be used for a solid-phase thermal growth process below 600° C. because they contain a small amount of alkali component. These kinds of glass show a very large coefficient of thermal contraction by heating them at 600° C. for 24 hours, for example. Therefore, when a thin film transistor is formed on such a glass substrate, a threshold voltage is observed to be shifted to a positive side by 2 to 5 volt because the substrate is thermally contracted by a heat-treatment in a crystallization process of the semiconductor film, so that a compression stress acts on an active layer of the thin film transistor and the interface condition of the active layer silicon/gate insulator layer is deteriorated.

In addition, since the thermal contraction of the substrate exceeds 200 ppm in a heating process for activating impurities doped in the thin film transistor, a pattern alignment is difficult even using a reduction projecting light exposure device having a mechanism of correcting a substrate expansion and contraction, especially when the diagonal length of the substrate exceeds 10 inches.

SUMMARY OF THE INVENTION

An object of this invention is to provide a method for forming on an insulating substrate a crystalline amorphous silicon thin film transistor in which high carrier mobility, low threshold voltage and high off-resistance can be stably obtained.

In order to attain the above and other objects, the method according to this invention is a method for changing a silicon thin film formed on an insulating substrate to a silicon thin film having crystallinity by a thermal process of 550 to 800° C. to produce a thin film transistor using a crystalline silicon thin film, wherein thermal contraction of the insulating substrate by the thermal process is controlled to be 30 to 500 ppm (parts per million), preferably 30 to 200 ppm to make film quality of the silicon thin film excellent, thereby stably producing a thin film transistor having high mobility, low threshold voltage and high off-resistance.

According to this invention, on a way of a thin film transistor forming process, a pattern is formed on the insulating substrate and the pattern formed on the insulating substrate is subjected to thermal treatment with thermal contraction of said insulating substrate being controlled to be 100 ppm or less.

In order to restrict the thermal contraction of the substrate to the above range, the insulating substrate is thermally treated at 550 to 800° C. before the silicon thin film is formed on the substrate.

By adopting the producing method of the thin film transistor mentioned above, mobilities of electron and hole exceed 80 $cm^2$/Vsec and 50 $cm^2$/Vsec respectively, and the absolute value of a threshold voltage of NMOS and PMOS can be stabilized under 6 volts.

In addition, a thin film transistor in which an off-resistance of 1GΩ or more could be obtained for $|V_{DS}|=5V$ and $V_G=0V$ could be produced without a special structure of transistor.

Further, since thermal contraction of the insulating substrate was suppressed below 100 ppm by the thermal treatment of the insulating substrate in the manner as described above, and thus the patterning can be carried out with a low-price contact-type light exposure device or a proximity light exposure device.

There has been conventionally a technical idea that the thermal contraction should be suppressed to the utmost or that the degree of the thermal contraction of the semiconductor itself is coincident with that of the thermal contraction of the substrate. However, this invention differs from the above conventional technical idea, and has a novel technical idea that a compression stress is applied to the semiconductor film to the extent that characteristics of the semiconductor film are not deteriorated, thereby obtaining a thin film transistor having good semiconductor characteristics, high mobility, low threshold voltage and high off-resistance.

That is, the compression stress is slightly applied to the semiconductor film so that the thermal contraction of the substrate in a crystallization process is controlled to be above 30 ppm, and in order to prevent deterioration of the characteristics of the semiconductor film due to the excessive compression stress, the upper limit of the thermal contraction of the substrate is restricted to 500 ppm or less, preferably below 200 ppm, thereby realizing more excellent film characteristics.

Further, there is a problem in the thin film transistor forming process that if the substrate is contracted in a process after the patterning treatment, an alignment process cannot be carried out in a next process. Therefore, the thermal contraction of the substrate is set 200 ppm or less, preferably 100 ppm or less to perform the alignment process. Especially for the thermal contraction of 100 ppm or less, a contacting light-exposure type and a proximity light exposure type of an alignment device are usable, so that the thin film transistor can be produced with a low-cost device.

DETAILED DESCRIPTION OF THE INVENTION

Preferred embodiments will be described hereunder with reference to the accompanying drawings.

(Embodiment 1)

FIG. 1 is a schematic diagram of a producing process of an embodiment of a thin film transistor of this invention. A glass substrate 100 was first annealed at 600° C. in a oven for a long time. A 48-hours annealing was enough when an used substrate was formed of crystallized glass, for example. At this time, the substrate was contracted by about 300 ppm. In order to prevent diffusion of impurities in the glass substrate, a silicon-oxide film 101 was formed in 1000 Å to 3000 Å by a sputtering method.

Figure 1A:
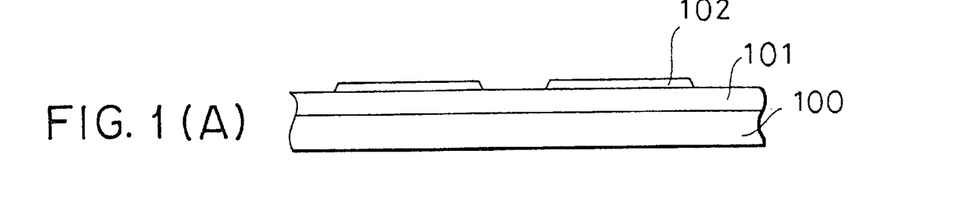
FIGS. 1(A)–1(F) are a longitudinal-sectional view of a producing process of a thin film transistor according to this invention.

Next, amorphous silicon film 102 was formed in 1500 Å thickness by a low pressure CVD method or a plasma CVD method, and annealed at 600° C. for 48 hours and further at 800° C. for one hour successively, to crystallize the amorphous silicon. Thereafter, an ordinary producing process of a thin film transistor was carried out.

First, a crystallized silicon film was patterned in an islandish form as shown in FIG. 1(a). Next, a silicon oxide film 103 was formed as a gate insulating film in 1000 Å thickness by the sputtering method. The sputtering process was carried out in 100% oxygen atmosphere using a synthetic quartz as a sputtering target. Although the thin film transistor could be also produced using a silicon oxide film produced by an atmospheric pressure CVD method, a low pressure CVD method and a photo CVD method, it was found out that a silicon oxide film formed by the sputtering method had most excellent characteristics. Thereafter, an $n^+$-silicon layer 104 containing phosphorus or arsenic of about $1\times10^{21}$ or more was formed by the low pressure CVD method or plasma CVD method, and then a gate electrode was formed by the patterning process as shown in FIG. 1(b).

Figure 1B:
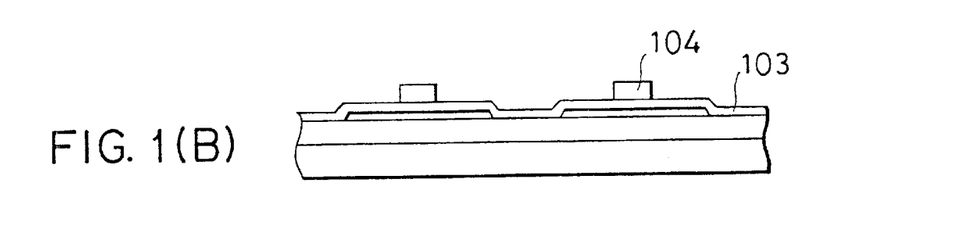
Figure 1C:
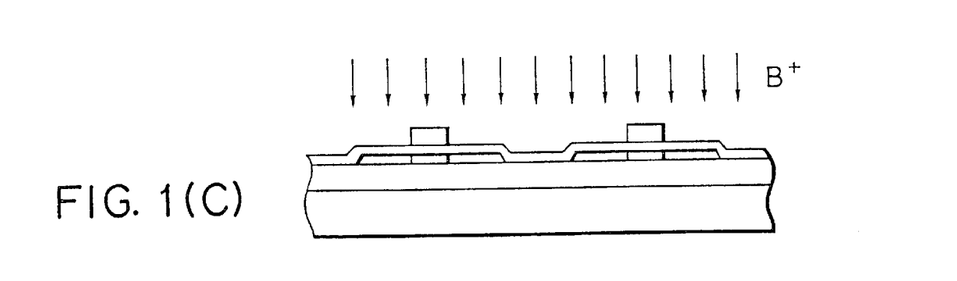
Figure 1D:
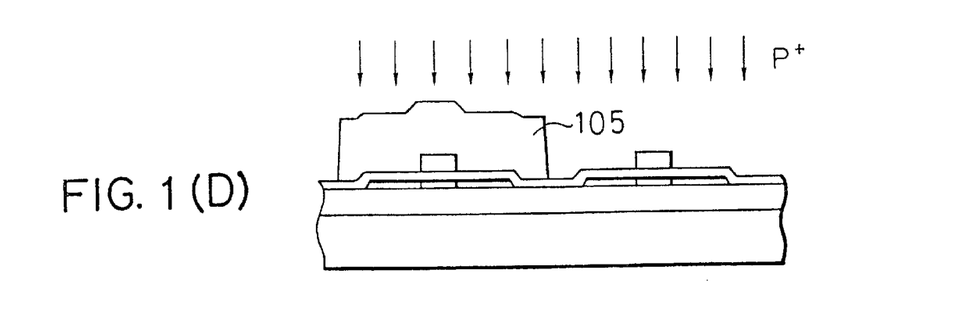

At this state, boron of $1\times10^{15}$ atoms/cm$^2$ was injected to the whole surface of the element as shown in FIG. 1(b) by an ion implantation method as shown in FIG. 1(c). Further, a region at which a PMOS would be formed was covered by a resist 105 or the like, and a region at which an NMOS would be formed was doped with phosphorus of $5\times10^{15}$ atoms/cm$^2$ by the ion implantation as shown in FIG. 1(d). Source and drain semiconductor regions were then formed in the silicon film in the PMOS and the NMOS. The thermal contraction of the substrate was observed to be 10 ppm or less after an activation treatment at 600° C. for 24 hours, and thus there was no problem for a positioning of a photomask.

Figure 1E:
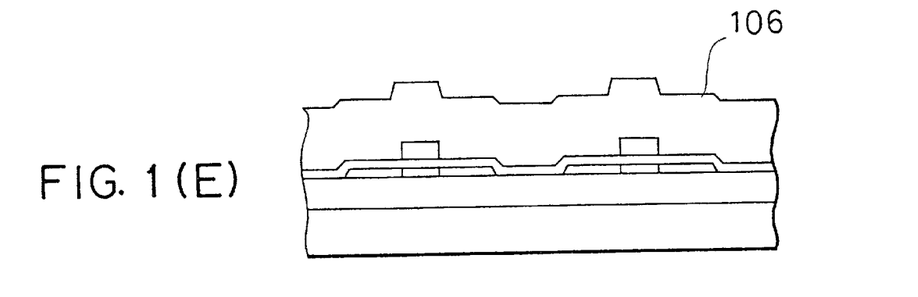
Figure 1F:
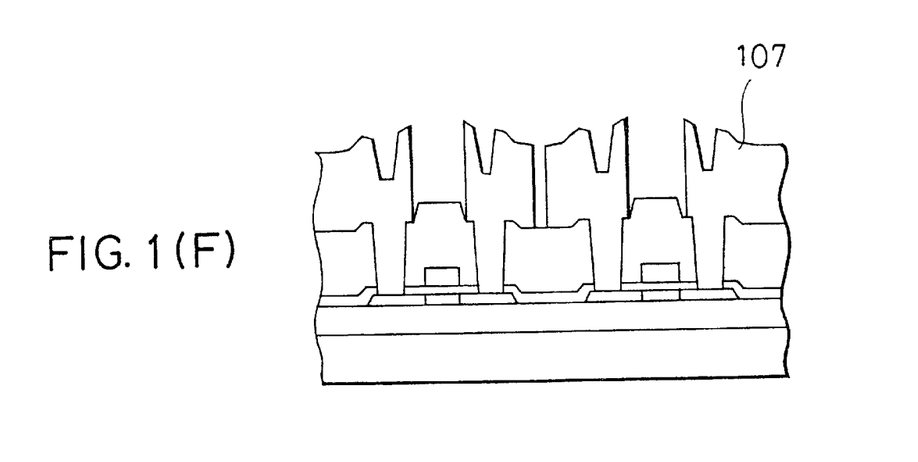

Thereafter, a silicon-oxide film of about 1 micron was formed as an interlayer insulating film 106 by the atmospheric pressure CVD method or sputtering method as shown in FIG. 1(e). After a contact hole was formed in the interlayer insulating film, Al electrode 107 was formed and the patterning process was carried out as shown in FIG. 1(f), the element thus formed was sintered at 375° C. to form the thin film transistor.

Figure 2A:
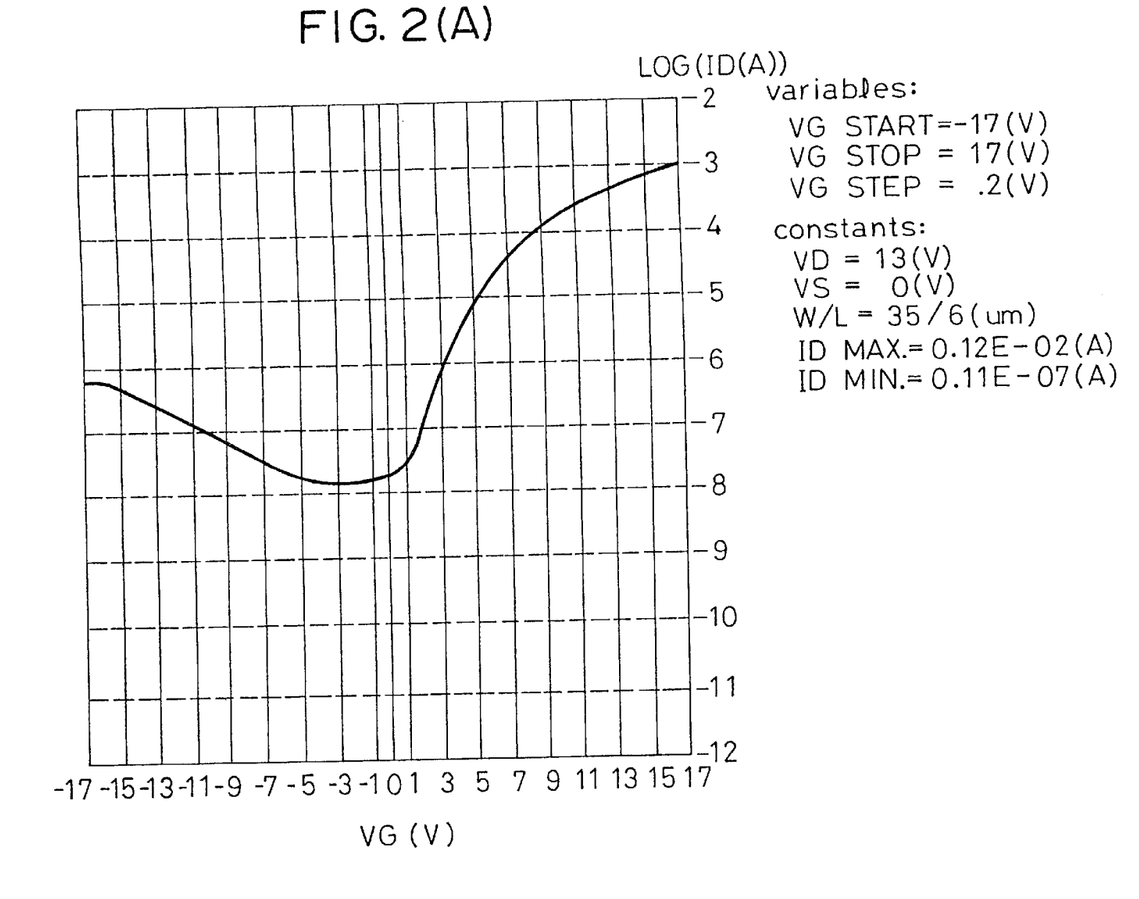
FIGS 2(A)–2(B) are a graph showing static characteristics of gate voltage—source/drain current of the thin film transistor according to this invention.
Figure 2B:
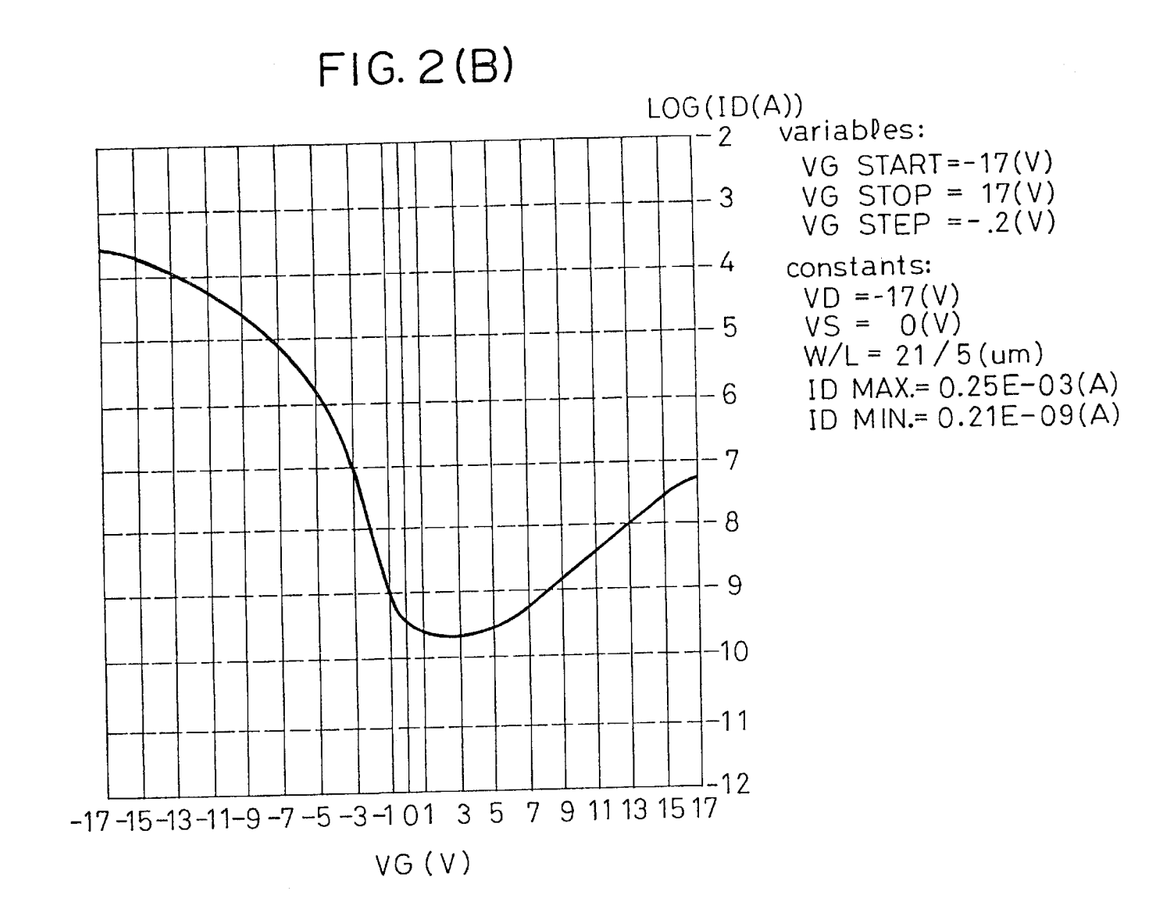

FIG. 2(a) and FIG. 2(b) show measured static characteristics of NMOS and PMOS respectively of a silicon thin film transistor which was produced by the method as described above. Ratios of channel-length/channel-width of NMOS and PMOS were 5 micron/21 micron, and 6 micron/35 micron respectively, and a measurement condition is listed in the figures. Both of the static characteristics showed good characteristics. A field effect mobility $\mu$FE was 81.5 cm$^2$/Vsec and 55.2 cm$^2$/Vsec respectively and a threshold voltage $V_{th}$ is 3.2 V and −4.8 V, respectively.

(Embodiment 2)

A thin film transistor was produced in the same process as the embodiment 1, except that the anneal process at 800° C. for an hour after the solid-phase growth in the annealing process at 600° C. for 48 hours was not carried out.

Figure 3A:
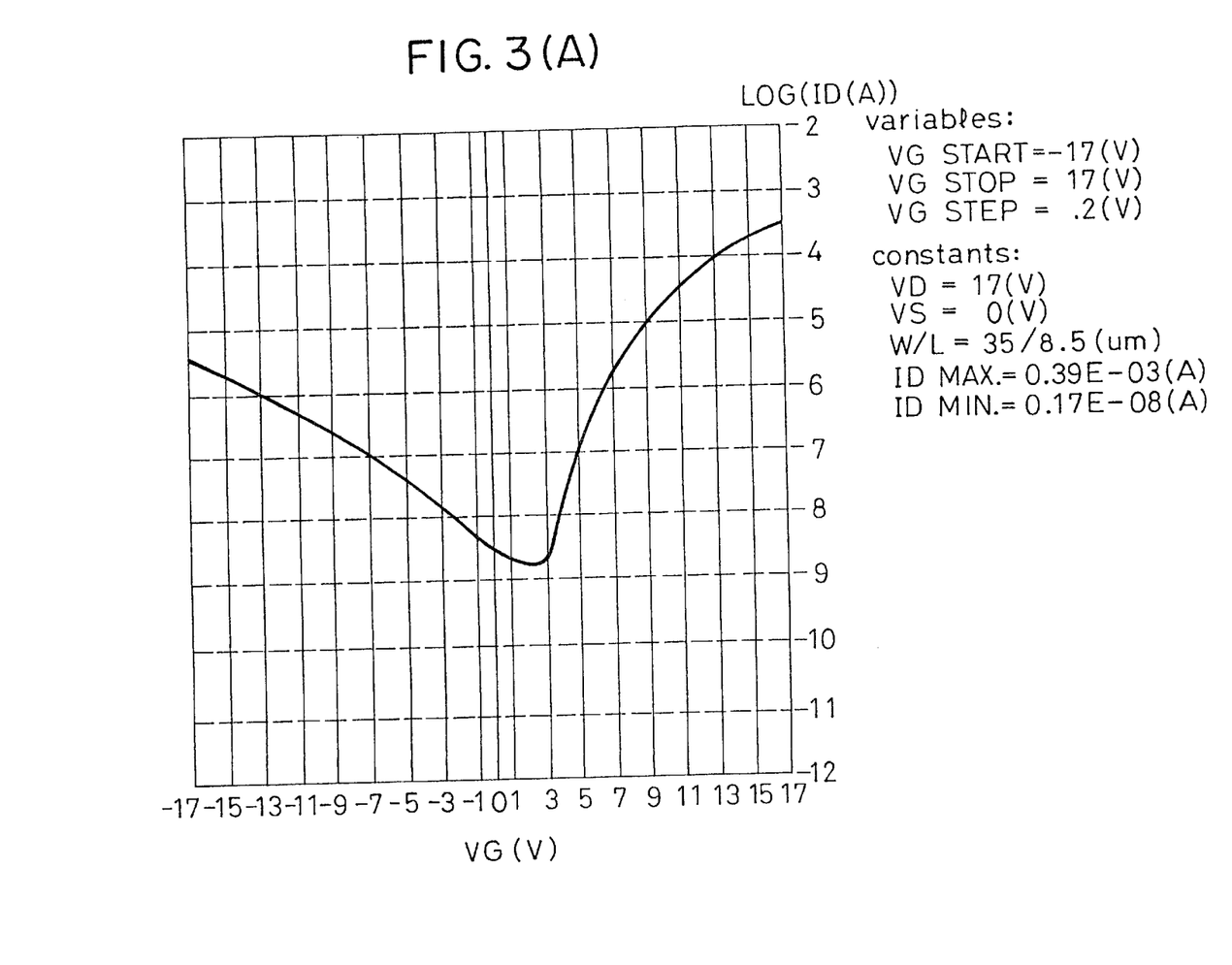
FIGS. 3(a)–3(B) are another graph of static characteristics of gate voltage—source/drain current of the thin film transistor according to this invention.
Figure 3B:
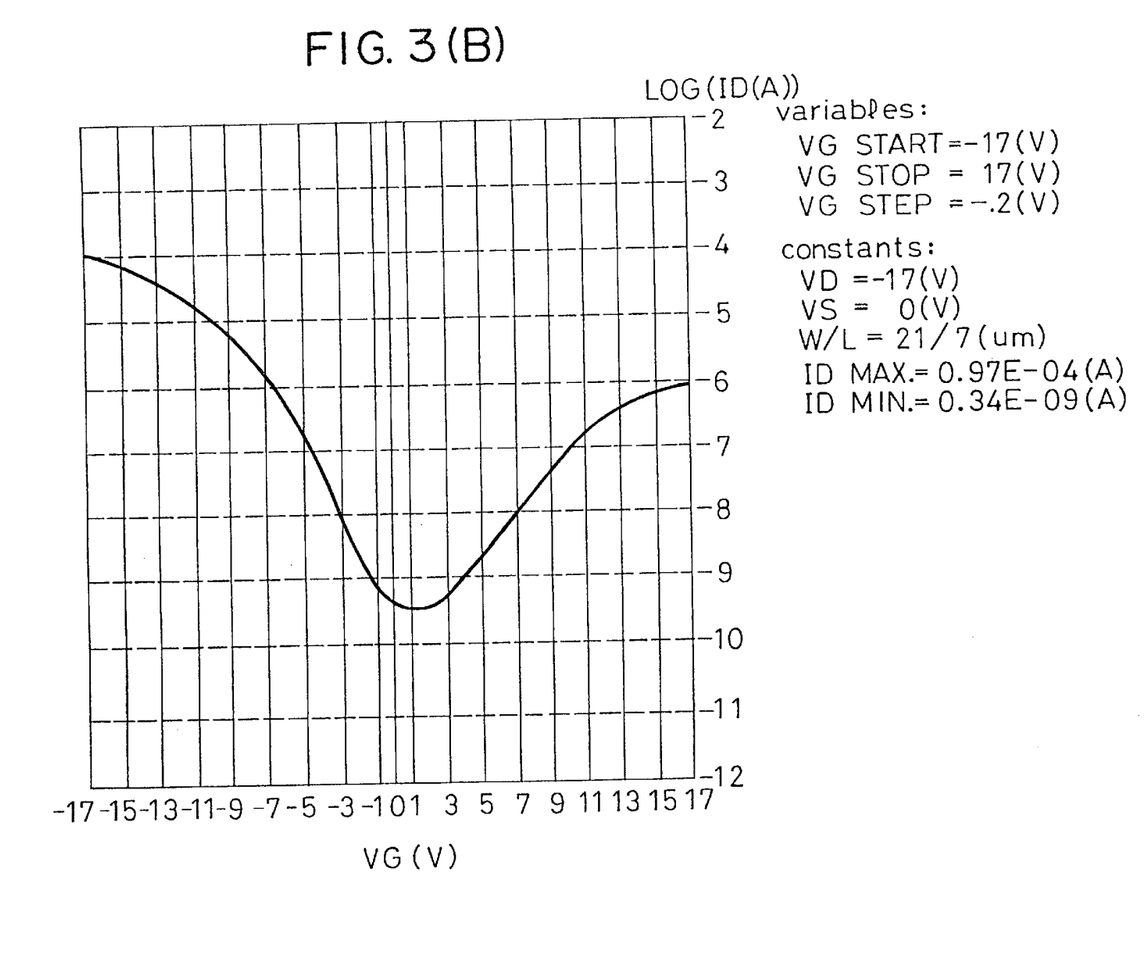

FIGS. 3(a) and (b) show static characteristics of the thin film transistor thus formed. Since the thermal contraction of the substrate after the activation treatment of an impurity region was about 30 ppm, there was no problem for the subsequent patterning process. Field effect mobilities of NMOS and PMOS were 57.7 cm$^2$/Vsec and 36.3 cm$^2$/Vsec, respectively, and threshold voltages thereof were 5.2 V and −5.7 V.

Comparison Example

An example using a low alkali glass different from that of the embodiment 1 will be shown as a comparison example. First, a pre-anneal process was carried out at 600° C. for 48 hours, and a solid-phase growth was carried out by the annealing treatment at 600° C. for 48 hours. The subsequent processes were identical to those of the embodiment 1. In this process, the thermal contraction were measured to be 900 to 1000 ppm in the solid-phase growth process and 300 ppm in the activation process.

Figure 4:
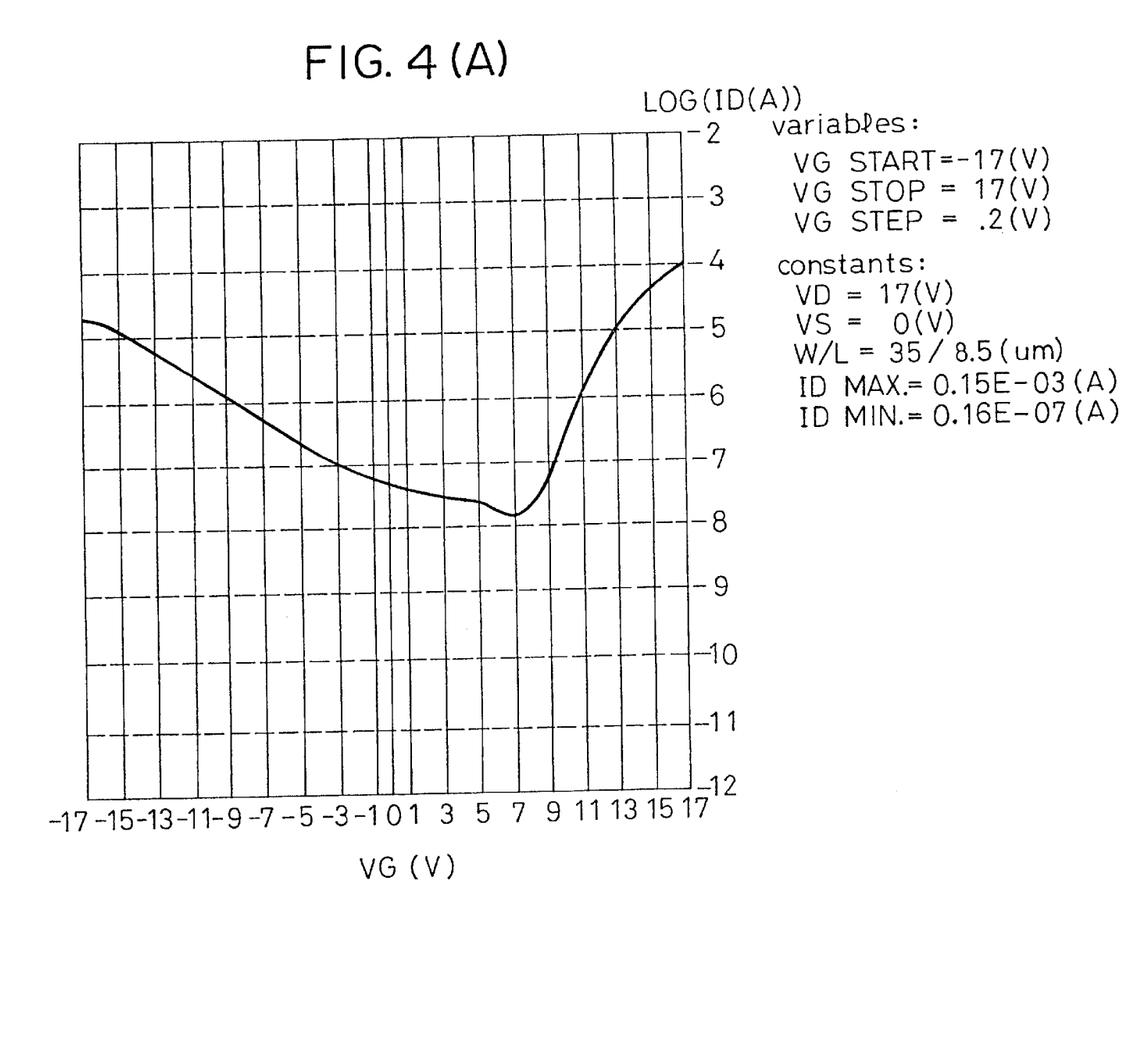
FIGS. 4(A)–4(B) are a graph of static characteristics of gate voltage—source/drain current of a thin film transistor produced by a comparison example.
Figure 4B:
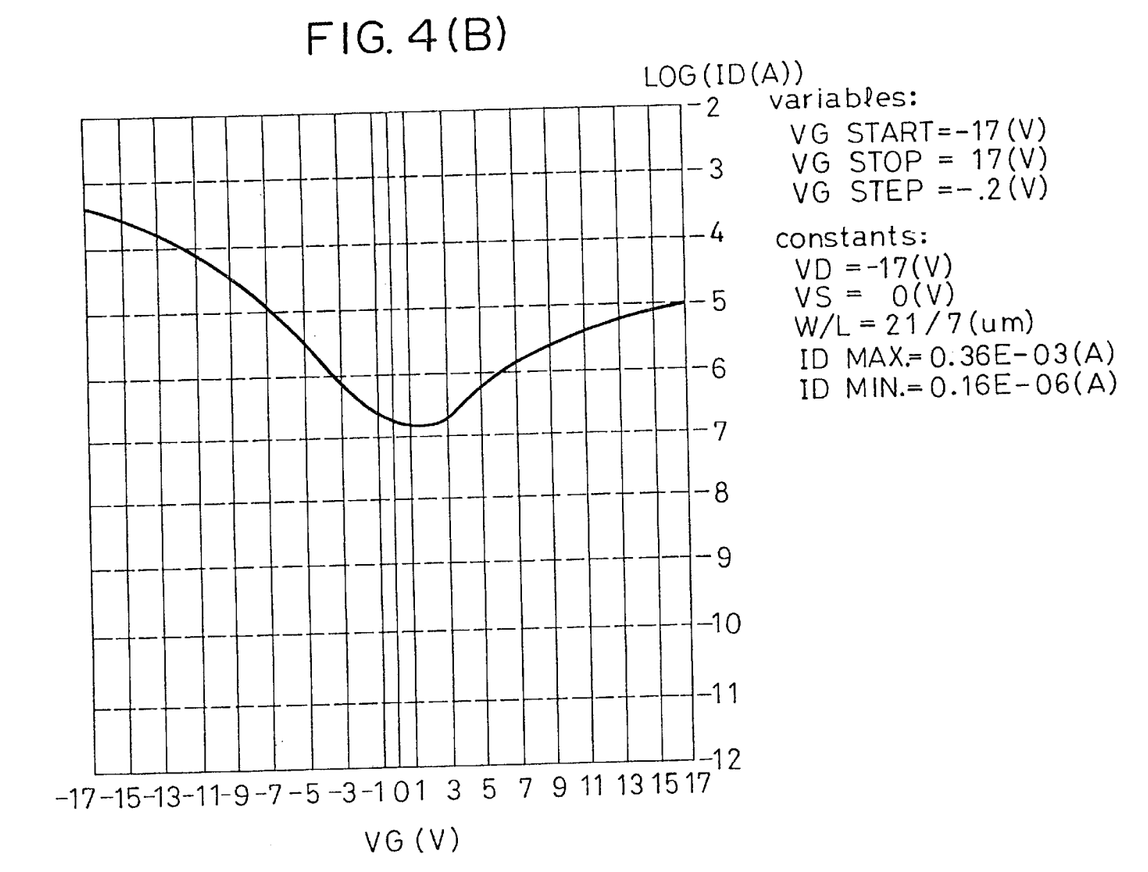

It was found from the measurement of the characteristics of the thin film transistor thus obtained that a threshold voltage is shifted to a positive gate voltage side by 3 to 4 volts for NMOS and by 2 to 3 volts for PMOS as shown in FIGS. 4(a) and (b). In addition, a phenomena that rise-up of a current value of the PMOS is sluggish was observed.

Further, in the processes, the mask alignment was very difficult because the thermal contraction of the substrate in the activation treatment process after the patterning process was excessively large, so that the thin film transistor could be formed on only a part of the substrate.

According to the thin film transistor producing method as described above, a thin film transistor having an electron mobility of 80 cm$^2$/Vsec or more and a hole mobility of 50 cm$^2$/Vsec or more can be obtained, and the absolute value of a threshold voltage of each of NMOS and PMOS can be stabilizingly set 6 volts or less. In addition, a thin film transistor in which an off-resistance of 1GΩ or more could be obtained for $|V_{DS}|=5V$ and $V_G=0V$ could be produced without a special structure of transistor.

Further, the thermal contraction of the substrate in the heat treatment process after the patterning process can be restricted to a value below 100 ppm, so that the patterning process can be carried out using a low-price contact light exposure device or proximity light exposure device.

What is claimed is:

1. A method for manufacturing a semiconductor device having a p-channel thin film transistor and an n-channel thin film transistor, said method comprising the steps of:

preheating a glass substrate in order to contract said glass substrate;

forming a semiconductor film comprising silicon over said glass substrate;

crystallizing said semiconductor film, wherein said glass substrate shrinks during the crystallizing step at 30–500 ppm;

patterning said semiconductor film after said crystallizing step into at least two semiconductor islands;

forming at least one pair of impurity regions in each of said semiconductor islands; and activating said impurity regions, wherein said glass substrate contracts less than 100 ppm during the steps subsequent to said patterning through said activating, and wherein said p-channel thin film transistor has an absolute value of a threshold voltage of 6V or less and a field effect mobility of 50 cm$^2$/Vsec or higher, and wherein said n-channel thin film transistor has an absolute value of a threshold voltage of 6V or less and a field effect mobility of 80 cm$^2$/Vsec or higher.

2. A method for manufacturing a semiconductor device having a p-channel thin film transistor and an n-channel thin film transistor, said method comprising the steps of:

preparing a glass substrate which has been preheated in order to contract said glass substrate;

forming a semiconductor film comprising silicon over said glass substrate;

crystallizing said semiconductor film, wherein said glass substrate shrinks during the crystallizing step at 30–500 ppm;

patterning said semiconductor film after said crystallizing step into at least two semiconductor islands;

forming at least one pair of impurity regions in each of said semiconductor islands; and activating said impurity regions, wherein said glass substrate contracts less than 100 ppm during the steps subsequent to said patterning through said activating, and wherein said p-channel thin film transistor has an absolute value of a threshold voltage of 6V or less and a field effect mobility of 50 cm$^2$/Vsec or higher and said n-channel thin film transistor has an absolute value of a threshold voltage of 6V or less and a field effect mobility of 80 cm$^2$/Vsec or higher.

3. A method for manufacturing a thin film transistor comprising the steps of:

preparing a glass substrate which has been preheated in order to contract said glass substrate;

forming an insulating film on said glass substrate, wherein said insulating film prevents diffusion of impurities in said glass substrate;

forming a semiconductor film comprising silicon over said insulating film;

crystallizing said semiconductor film, wherein said glass substrate shrinks during the crystallizing step at 30–500 ppm;

patterning said semiconductor film after said crystallizing step into at least one semiconductor island;

forming at least one pair of impurity regions in said semiconductor island; and activating said impurity regions, wherein said glass substrate contracts less than 100 ppm during the steps subsequent to said patterning through said activating.

4. A method for manufacturing a thin film transistor comprising the steps of:

preparing a glass substrate which has been preheated in order to contract said glass substrate;

forming a semiconductor film comprising silicon over said glass substrate;

crystallizing said semiconductor film, wherein said glass substrate shrinks during the crystallizing step at 30–500 ppm;

patterning said semiconductor film after said crystallizing step into at least one semiconductor island;

forming at least one pair of impurity regions in said semiconductor island; and activating said impurity regions, wherein said glass substrate contracts less than 100 ppm during the steps subsequent to said patterning through said activating.

5. A method for manufacturing a thin film transistor, said method comprising the steps of:

preheating a glass substrate in order to contract said glass substrate;

forming a semiconductor film comprising silicon over said glass substrate;

crystallizing said semiconductor film, wherein said glass substrate shrinks during the crystallizing step at 30–500 ppm;

patterning said semiconductor film after said crystallizing step into at least one semiconductor island;

forming at least one pair of impurity regions in said semiconductor island; and activating said impurity regions, wherein said glass substrate contracts less than 100 ppm during the steps subsequent to said patterning through said activating.

6. A method for manufacturing a thin film transistor, said method comprising the steps of:

preheating a glass substrate in order to contract said glass substrate;

forming an insulating film on said glass substrate, wherein said insulating film prevents diffusion of impurities in said glass substrate;

forming a semiconductor film comprising silicon over said insulating film;

crystallizing said semiconductor film, wherein said glass substrate shrinks during the crystallizing step at 30–500 ppm;

patterning said semiconductor film after said crystallizing step into at least one semiconductor island;

forming at least one pair of impurity regions in said semiconductor island; and activating said impurity regions, wherein said glass substrate contracts less than 100 ppm during the steps subsequent to said patterning through said activating.

7. A method for manufacturing a semiconductor device having a p-channel thin film transistor and an n-channel thin film transistor, said method comprising the steps of:

preheating a glass substrate in order to contract said glass substrate;

forming an insulating film on said glass substrate, wherein said insulating film prevents diffusion of impurities in said glass substrate;

forming a semiconductor film comprising silicon over said insulating film;

crystallizing said semiconductor film, wherein said glass substrate shrinks during the crystallizing step at 30–500 ppm;

patterning said semiconductor film after said crystallizing step into at least two semiconductor islands;

forming at least one pair of impurity regions in each of said semiconductor islands; and activating said impurity regions.

8. A method for manufacturing a semiconductor device having a p-channel thin film transistor and an n-channel thin film transistor, said method comprising the steps of:

preparing a glass substrate which has been preheated in order to contract said glass substrate;

forming an insulating film on said glass substrate, wherein said insulating film prevents diffusion of impurities in said glass substrate;

forming a semiconductor film comprising silicon over said insulating film;

crystallizing said semiconductor film, wherein said glass substrate shrinks during the crystallizing step at 30–500 ppm;

patterning said semiconductor film after said crystallizing step into at least two semiconductor islands;

forming at least one pair of impurity regions in each of said semiconductor islands; and activating said impurity regions.

9. A method of manufacturing a semiconductor device comprising the steps of:

forming an insulating film on a glass substrate;

forming a semiconductor film over said insulating film;

crystallizing said semiconductor film, wherein said glass substrate shrinks at 30 to 500 ppm during the crystallization of the semiconductor film; and patterning the crystallized semiconductor film into at least one semiconductor island for forming a channel region of a thin film transistor, wherein a thermal contraction of said glass substrate caused by any heating step which is performed after said patterning step is below 100 ppm.

10. A method of manufacturing a semiconductor device comprising the steps of:

forming a semiconductor film over a glass substrate;

crystallizing said semiconductor film wherein said glass substrate shrinks at 30 to 500 ppm during the crystallization of the semiconductor film; and patterning the crystallized semiconductor film into at least one semiconductor island for forming a channel region of a thin film transistor, wherein a thermal contraction of said glass substrate caused by any heating step which is performed after said patterning step is below 100 ppm.

11. The method of claim 1 wherein said patterning is performed by using an aligner of a contact light exposure.

12. The method of claim 1 wherein said patterning is performed by using an aligner of a proximity light exposure.

13. The method of claim 2 wherein said patterning is performed by using an aligner of a contact light exposure.

14. The method of claim 2 wherein said patterning is performed by using an aligner of a proximity light exposure.

15. The method of claim 3 wherein said patterning is performed by using an aligner of a contact light exposure.

16. The method of claim 3 wherein said patterning is performed by using an aligner of a proximity light exposure.

17. The method of claim 3 wherein said first film has a thickness of 1000 to 3000 Å A and comprises silicon oxide.

18. The method of claim 4 wherein said patterning is performed by using an aligner of a contact light exposure.

19. The method of claim 4 wherein said patterning is performed by using an aligner of a proximity light exposure.

20. The method of claim 5 wherein said patterning is performed by using an aligner of a contact light exposure.

21. The method of claim 5 wherein said patterning is performed by using an aligner of a proximity light exposure.

22. The method of claim 6 wherein said patterning is performed by using an aligner of a contact light exposure.

23. The method of claim 6 wherein said patterning is performed by using an aligner of a proximity light exposure.

24. The method of claim 6 wherein said first film has a thickness of 1000 to 3000 Å and comprises silicon oxide.

25. The method of claim 7 wherein said patterning is performed by using an aligner of a contact light exposure.

26. The method of claim 7 wherein said patterning is performed by using an aligner of a proximity light exposure.

27. The method of claim 7 wherein said first film has a thickness of 1000 to 3000 Å and comprises silicon oxide.

28. The method of claim 8 wherein said patterning is performed by using an aligner of a contact light exposure.

29. The method of claim 8 wherein said patterning is performed by using an aligner of a proximity light exposure.

30. The method of claim 8 wherein said first film has a thickness of 1000 to 3000 Å and comprises silicon oxide.

31. The method according to claim 10, wherein said glass substrate shrinks at 200 ppm or less during said crystallization.

32. The method according to claim 9 wherein said semiconductor film comprises amorphous silicon.

33. The method according to claim 9 wherein said heating step is conducted for activating source and drain regions formed in said semiconductor island.

34. The method according to claim 10 wherein said semiconductor film comprises amorphous silicon.

35. The method according to claim 10 wherein said heating step is conducted for activating source and drain regions formed in said semiconductor island.

36. The method according to claim 9 wherein said thin film transistor has an absolute value of a threshold voltage of 6V or less.

37. The method according to claim 9 wherein said thin film transistor is a P-channel transistor and a field effect mobility of 50 cm$^2$/Vsec or higher.

38. The method according to claim 9 wherein said thin film transistor is an N-channel transistor and a field effect mobility of 80 cm$^2$/Vsec or higher.

39. The method according to claim 9 further comprising a step of forming an film comprising silicon oxide between said glass substrate and said semiconductor film.

40. The method according to claim 9 further comprising a step of heating said glass substrate prior to forming said semiconductor film in order to contract said glass substrate.

41. The method according to claim 10 wherein said thin film transistor has an absolute value of a threshold voltage of 6V or less.

42. The method according to claim 10 wherein said thin film transistor is a P-channel transistor and a field effect mobility of 50 cm$^2$/Vsec or higher.

43. The method according to claim 10 wherein said thin film transistor is an N-channel transistor and a field effect mobility of 80 cm$^2$/Vsec or higher.

44. The method according to claim 10 further comprising a step of forming an film comprising silicon oxide between said glass substrate and said semiconductor film.

45. The method according to claim 10 further comprising a step of heating said glass substrate prior to forming said semiconductor film in order to contract said glass substrate.

46. The method of claim 1 wherein said glass substrate shrinks during the crystallizing step at 200 ppm or less.

47. The method of claim 2 wherein said glass substrate shrinks during the crystallizing step at 200 ppm or less.

48. The method of claim 3 wherein said glass substrate shrinks during the crystallizing step at 200 ppm or less.

49. The method of claim 4 wherein said glass substrate shrinks during the crystallizing step at 200 ppm or less.

50. The method of claim 5 wherein said glass substrate shrinks during the crystallizing step at 200 ppm or less.

51. The method of claim 6 wherein said glass substrate shrinks during the crystallizing step at 200 ppm or less.

52. The method of claim 7 wherein said glass substrate shrinks during the crystallizing step at 200 ppm or less.

53. The method of claim 8 wherein said glass substrate shrinks during the crystallizing step at 200 ppm or less.

* * * * *